United States Patent
Xie et al.

(10) Patent No.: US 10,770,585 B2
(45) Date of Patent: Sep. 8, 2020

(54) SELF-ALIGNED BURIED CONTACT FOR VERTICAL FIELD-EFFECT TRANSISTOR AND METHOD OF PRODUCTION THEREOF

(71) Applicant: GLOBALFOUNDRIES Inc., Grand Cayman (KY)

(72) Inventors: Ruilong Xie, Niskayuna, NY (US); Chanro Park, Clifton Park, NY (US); Andre Labonte, Mechanicville, NY (US); Daniel Chanemougame, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/139,917

(22) Filed: Sep. 24, 2018

(65) Prior Publication Data

US 2020/0098913 A1 Mar. 26, 2020

(51) Int. Cl.
| | |
|---|---|
| *H01L 29/66* | (2006.01) |
| *H01L 29/78* | (2006.01) |
| *H01L 21/762* | (2006.01) |
| *H01L 21/768* | (2006.01) |
| *H01L 21/28* | (2006.01) |
| *H01L 29/08* | (2006.01) |
| *H01L 29/49* | (2006.01) |
| H01L 23/532 | (2006.01) |

(52) U.S. Cl.
CPC .... *H01L 29/7827* (2013.01); *H01L 21/28088* (2013.01); *H01L 21/76224* (2013.01); *H01L 21/76834* (2013.01); *H01L 21/76897* (2013.01); *H01L 29/0847* (2013.01); *H01L 29/4966* (2013.01); *H01L 29/6656* (2013.01); *H01L 29/66666* (2013.01); H01L 23/5329 (2013.01)

(58) Field of Classification Search
None
See application file for complete search history.

(56) References Cited

U.S. PATENT DOCUMENTS

| | | |
|---|---|---|
| 5,077,228 A | 12/1991 | Eklund et al. |
| 6,172,390 B1 | 1/2001 | Rupp et al. |
| 6,191,448 B1 | 2/2001 | Forbes et al. |
| 6,593,612 B2 | 7/2003 | Gruening et al. |
| 2007/0075359 A1 | 4/2007 | Yoon et al. |
| 2019/0214305 A1* | 7/2019 | Bao ..................... H01L 21/3081 |
| 2019/0279981 A1* | 9/2019 | Ok .................. H01L 21/823885 |
| 2020/0006552 A1* | 1/2020 | Anderson ....... H01L 21/823487 |
| 2020/0013681 A1* | 1/2020 | Lee ......................... H01L 29/45 |

* cited by examiner

*Primary Examiner* — Ali Naraghi
(74) *Attorney, Agent, or Firm* — Ditthavong & Steiner P.C.

(57) ABSTRACT

A device including a self-aligned buried contact between spacer liners and isolated from a pull down (PD)/pull-up (PU) shared gate and an n-channel field-effect transistor (NFET) pass gate (PG) gate and method of production thereof. Embodiments include first and second high-k/metal gate (HKMG) structures over a first portion of a substrate, and a third HKMG structure over a second portion of the substrate; an inter-layer dielectric (ILD) over a portion of the substrate and on sidewalls of the first, second and third HKMG structures; a spacer liner on sidewalls of the ILD between the second and third HKMG structures; and a buried contact layer between the spacer liner and in a portion of the substrate.

10 Claims, 12 Drawing Sheets

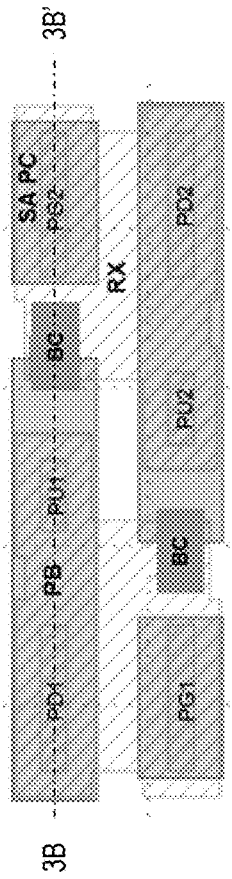
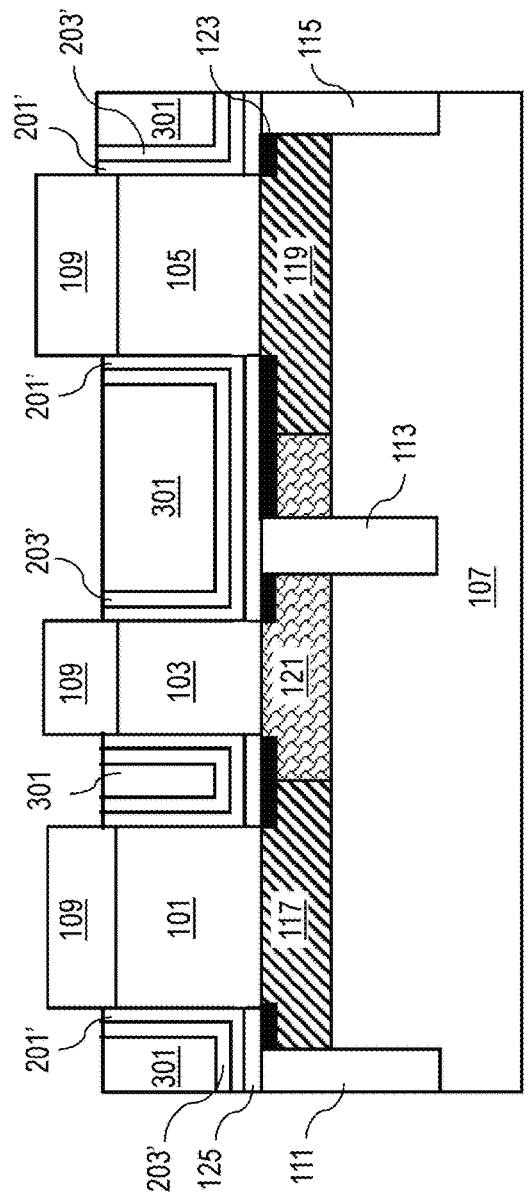
FIG. 3B
FIG. 3A

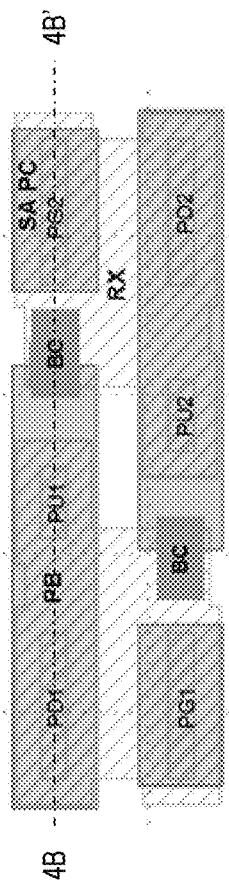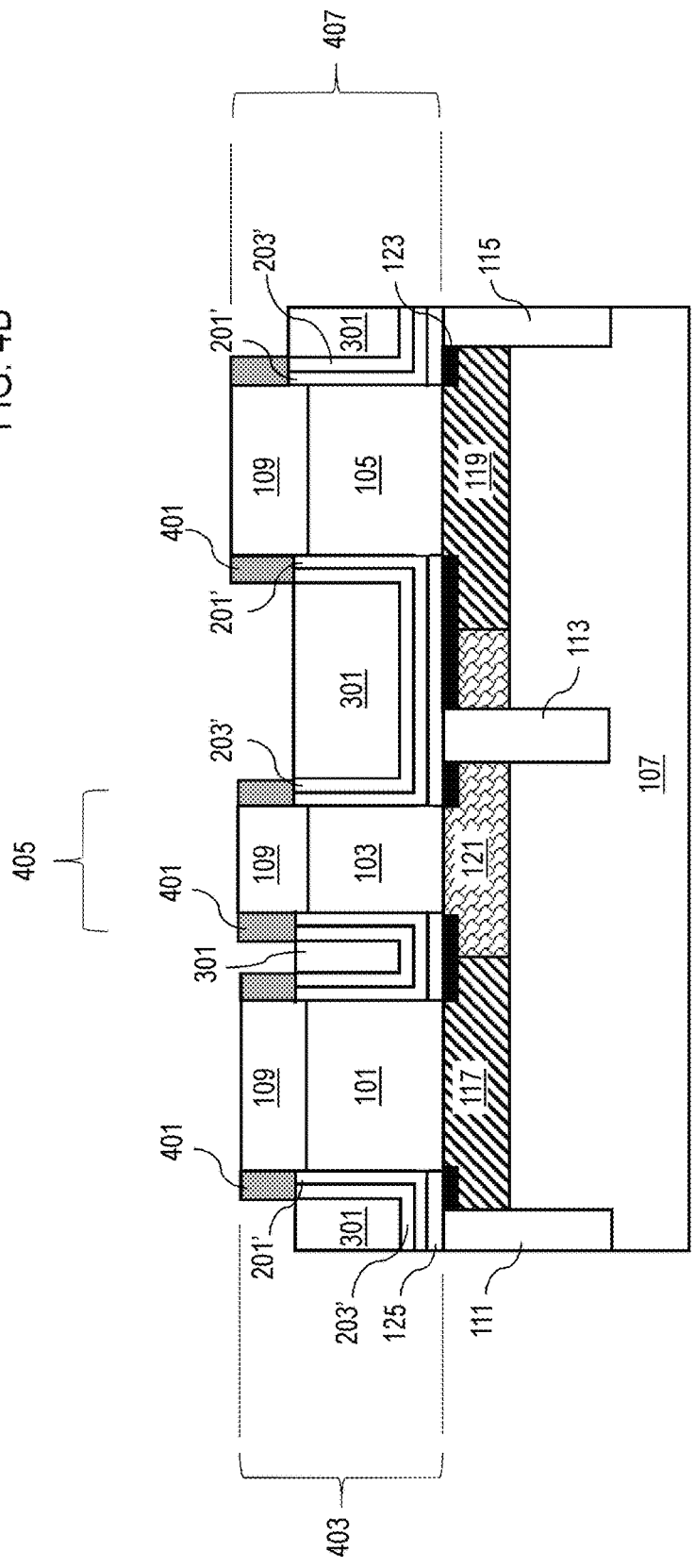
FIG. 4B
FIG. 4A

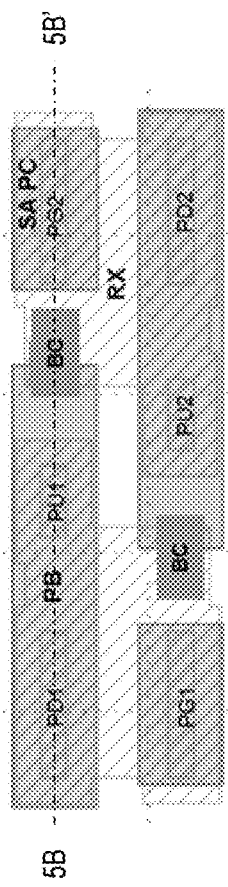
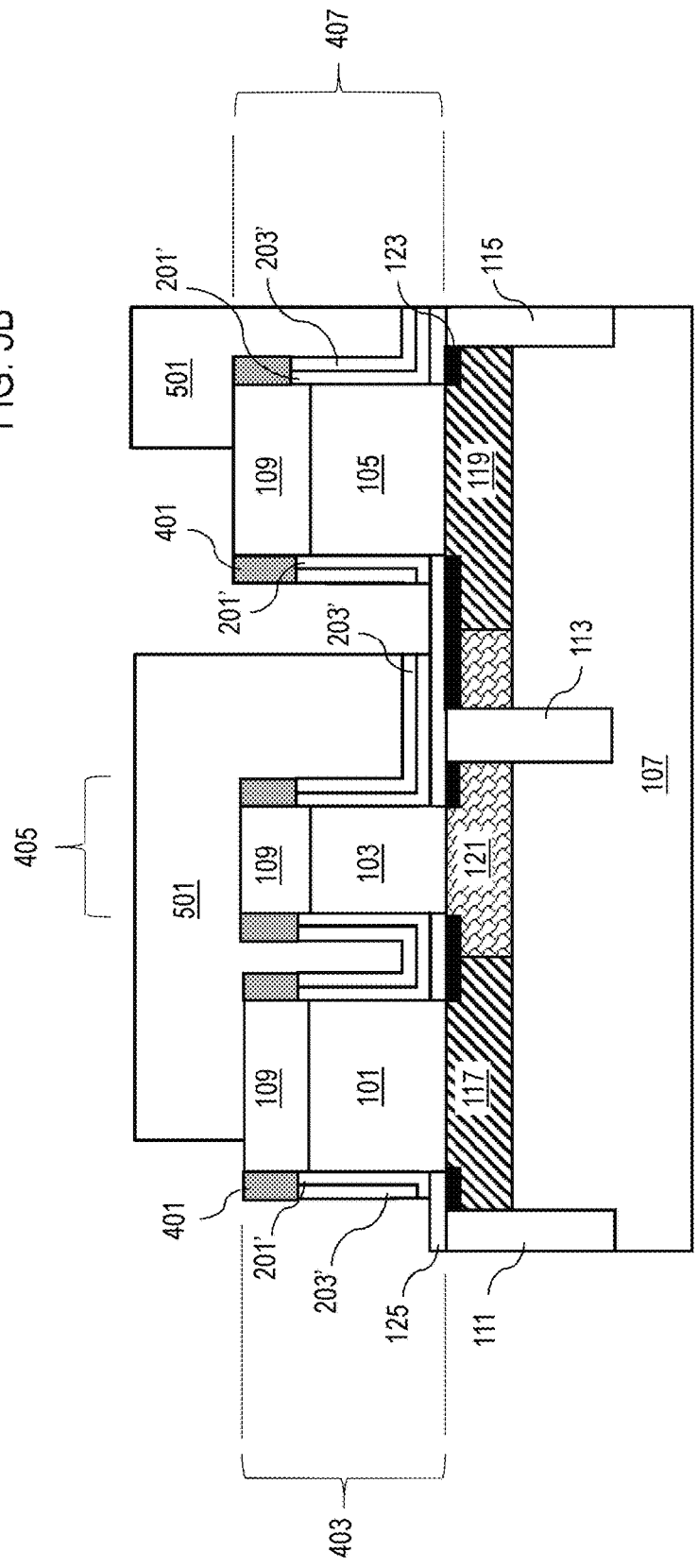
FIG. 5B
FIG. 5A

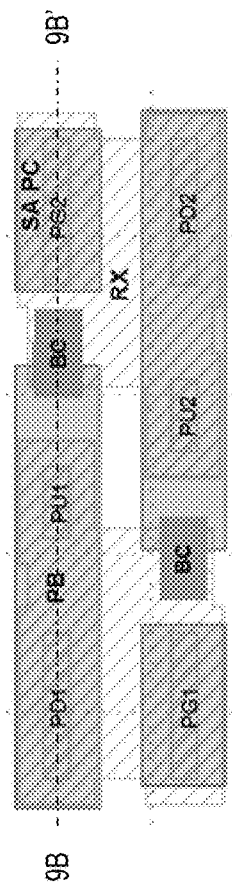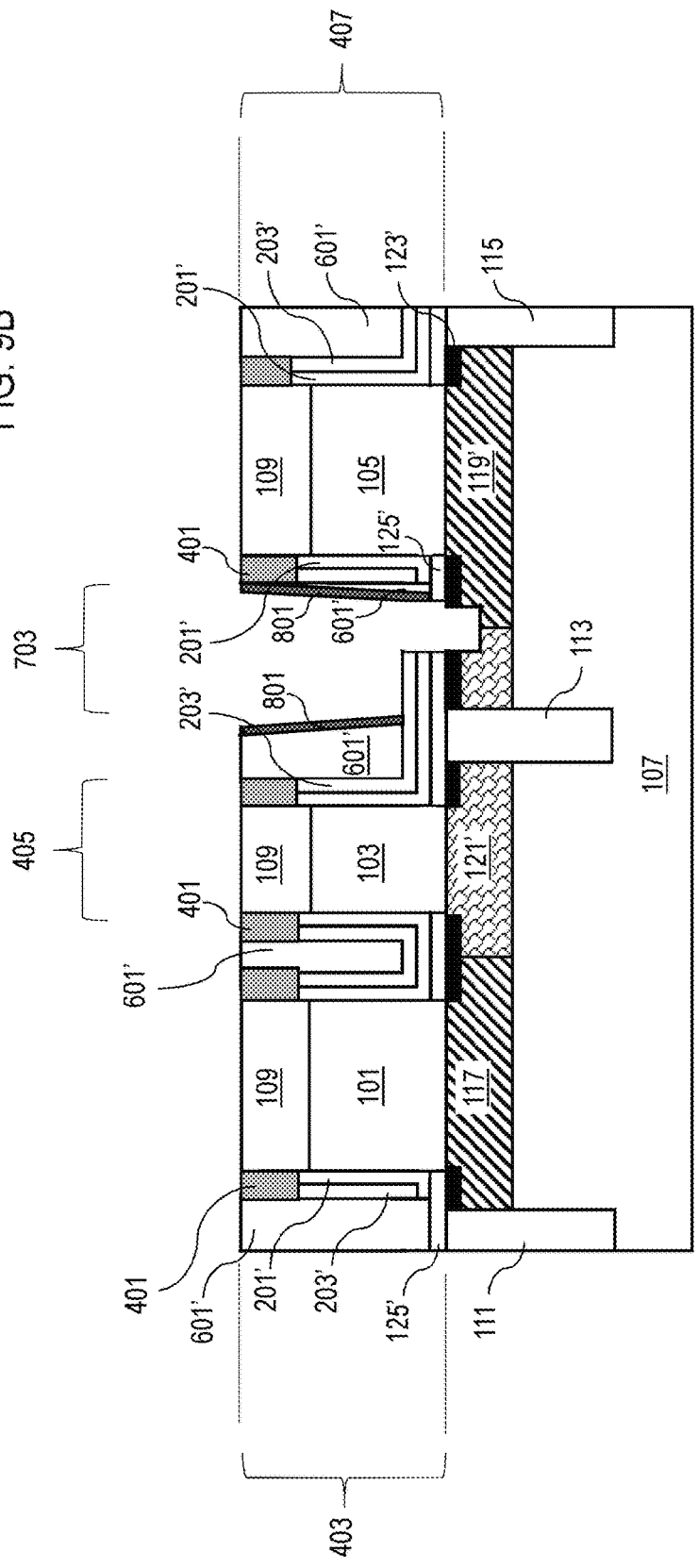

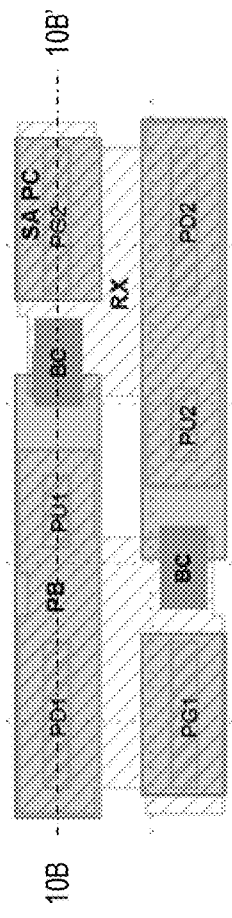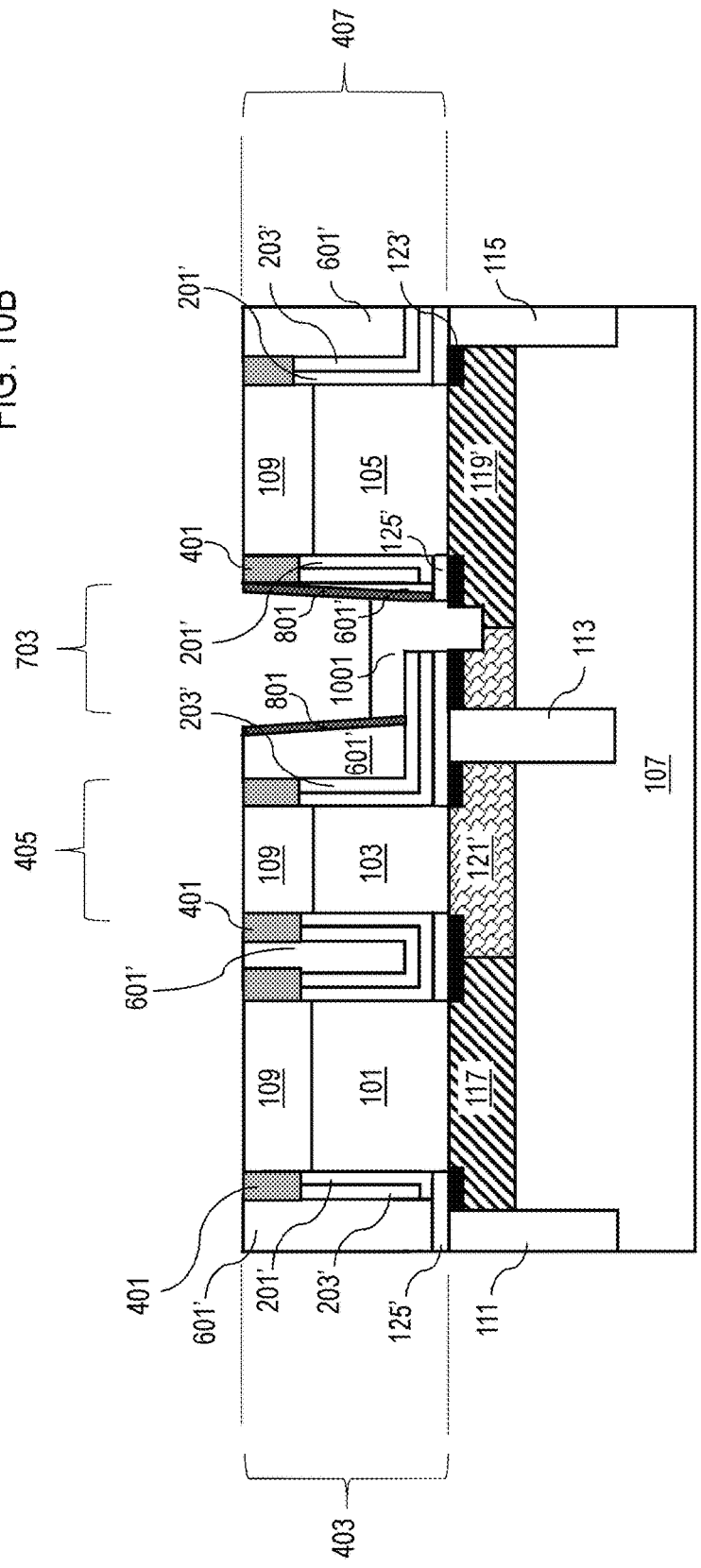
FIG. 10B
FIG. 10A

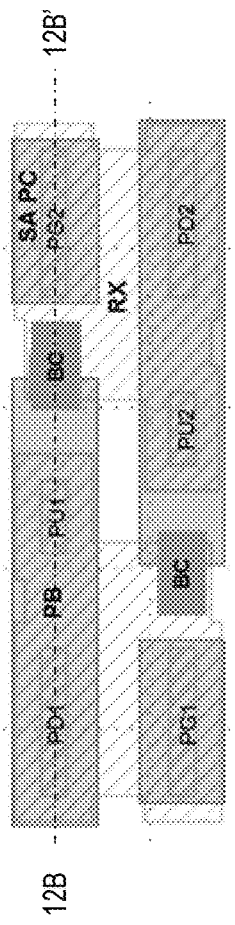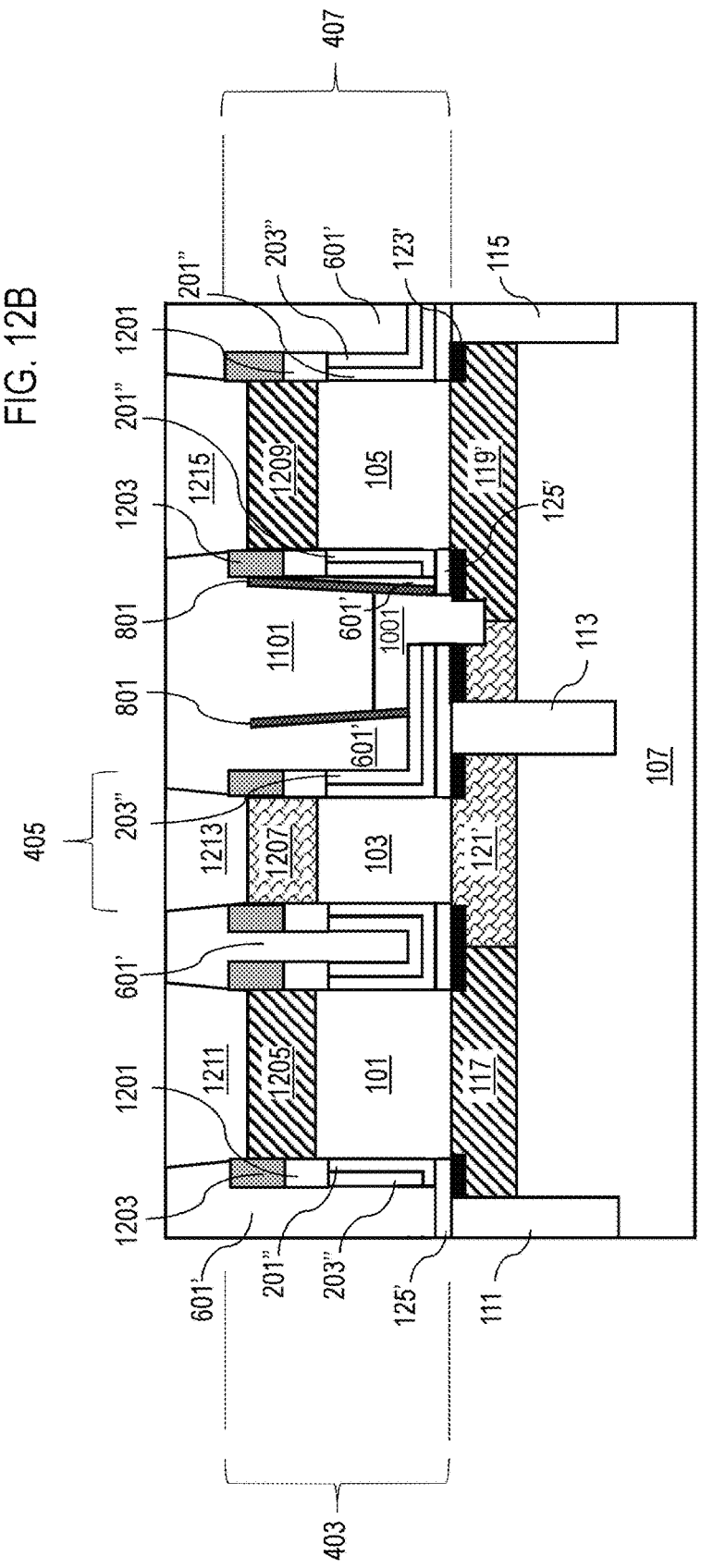
FIG. 12B
FIG. 12A

SELF-ALIGNED BURIED CONTACT FOR VERTICAL FIELD-EFFECT TRANSISTOR AND METHOD OF PRODUCTION THEREOF

TECHNICAL FIELD

The present disclosure relates to semiconductor devices, including integrated circuits (ICs). The present disclosure is particularly applicable to a vertical field-effect transistor (VFET) and methods of fabrication.

BACKGROUND

Cross-couple contact (XC) is mandatory in static random-access memory (SRAM) bit cells to connect an internal node (Q/QB) of an inverter to the gate of another inverter. XC is conventionally achieved by connecting a source/drain contact (TS) to a gate contact (CB), and is generally area efficient for fin field effect transistors (FinFETs) and planar FETs. However, VFET architecture is different than FinFETs or planar FETs, and the conventional XC or similar approaches are neither suitable nor area efficient for VFETs.

On the other hand, the architecture of VFETs offer a unique design opportunity: (i) the SRAM internal node (Q/QB) is naturally achieved through the design of the shared bottom active region (RX), and (ii) pass gate (PG) 1/PG 2 source/drain (S/D) are naturally connected to Q/QB. A buried contact (BC) XC can advantageously help SRAM area scaling. However, conventional BC integration is not self-aligned, therefore limiting bit cell scaling benefits. Furthermore, there is a risk of shorts between a buried contact and a self-aligned (SA) gate (PC). As a result, to limit the risk of shorts and ensure proper contact, design rules limit bit cell scaling.

A need, therefore, exists for devices with self-aligned BC relaxing or voiding critical design rules, and enabling significant additional scaling, process robustness, and control relief.

SUMMARY

An aspect of the present disclosure is a device including a self-aligned BC formed between spacer liners and isolated from a pull down (PD)/pull-up (PU) shared gate and an n-channel field-effect transistor (NFET) PG gate.

Another aspect of the present disclosure is a method of forming a self-aligned BC between spacer liners and isolated from a PD/PU shared gate and an NFET PG gate.

According to the present disclosure, some technical effects may be achieved in part by a device including: first and second high-k/metal gate (HKMG) structures over a first portion of a substrate, and a third HKMG structure over a second portion of the substrate; an inter-layer dielectric (ILD) over a portion of the substrate and on sidewalls of the first, second and third HKMG structures; a spacer liner on sidewalls of the ILD between the second and third HKMG structures; and a buried contact layer between the spacer liner and in a portion of the substrate.

Another aspect of the present disclosure is a method including forming first and second HKMG structures over a first portion of a substrate, and a third HKMG structure over a second portion of the substrate; forming an ILD over a portion of the substrate and on sidewalls of the first, second and third HKMG structures; forming a spacer liner on sidewalls of the ILD between the second and third HKMG structures; and forming a buried contact layer between the spacer liner and in a portion of the substrate.

A further aspect of the present disclosure is a device including first and second HKMG structures over a first portion of a silicon (Si) substrate, and a third HKMG structure over a second portion of the Si substrate; an ILD over a portion of the Si substrate and on sidewalls of the first, second and third HKMG structures; a spacer liner having a width of 4 nanometer (nm) to 10 nm on sidewalls of the ILD between the second and third HKMG structures; and a buried contact layer having a thickness of 10 nm to 50 nm between the spacer liner and in a portion of the Si substrate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 12A schematically illustrate cross-sectional views of a process flow for forming a self-aligned BC between spacer liners and isolated from a PD/PU shared gate and an NFET PG gate along the cut line 1B-1B' through 12B-12B' of FIGS. 1B through 12B, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of limited area scaling, yield and robustness attendant upon conventional BC integration. This problem is solved, inter alia, by forming a self-aligned BC between spacer liners and isolated from a PD/PU shared gate and an NFET PG gate.

Methodology in accordance with embodiments of the present disclosure includes forming first and second HKMG structures over a first portion of a substrate, and a third HKMG structure over a second portion of the substrate. An ILD is formed over a portion of the substrate and on sidewalls of the first, second and third HKMG structures. A spacer liner is formed on sidewalls of the ILD between the second and third HKMG structures, and a buried contact layer is formed between the spacer liner and in a portion of the substrate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
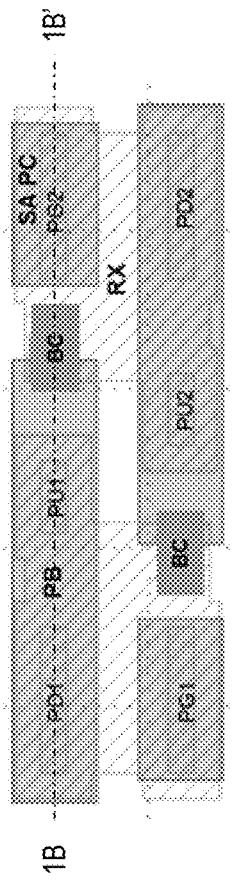
Figure 1A:
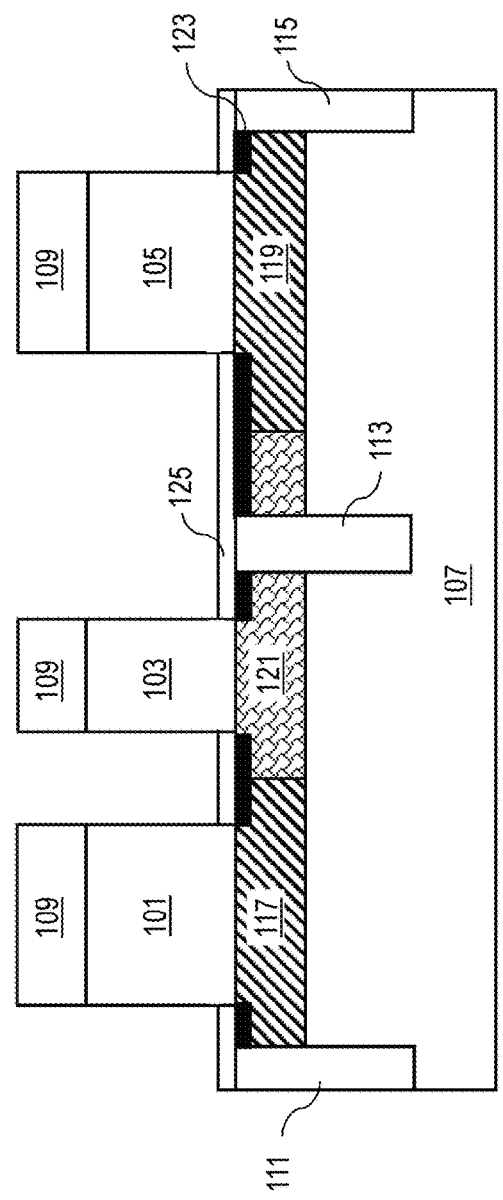

FIGS. 1A through 12A schematically illustrate cross-sectional views of a process flow for forming a self-aligned BC between spacer liners and isolated from a PD/PU shared gate and an NFET PG gate along the cut line 1B-1B' through 12B-12B' of FIGS. 1B through 12B, in accordance with an exemplary embodiment. Referring to FIG. 1A, a VFET includes fins 101, 103 and 105 formed, e.g., to a width (cross-section of FIN width direction is not shown here) of about 5 nm to about 10 nm, and to a length of about 5 nm to 500 nm, by a conventional patterning technique, over a portion of Si substrate 107. A hard mask (HM) 109 is formed, e.g., of silicon nitride (SiN) or other suitable material to a thickness of about 30 nm to about 150 nm, over fins 101, 103 and 105. Subsequently, shallow trench isolation (STI) regions 111 and 115 are formed in an outer portion of Si substrate 107, and STI region 113 is formed in Si substrate 107 and between fins 103 and 105. In one instance, STI regions 111, 113, and 115 include silicon dioxide ($SiO_2$) or other suitable material. In another instance, Si substrate 107 includes bottom S/D regions, e.g., a portion of Si substrate 107 below fins 101 and 105 includes silicon-phosphorus (SiP) by a P-type doping forming bottom S/D regions 117 and 119. In a further instance, an NFET, and a portion of Si substrate 107 below fin 103 includes silicon germanium doped with boron (SiGe:B) by a B-type doping forming bottom S/D region 121 and a p-channel field-effect transistor (PFET). A silicide layer 123 is then optionally formed, e.g., of titanium (Ti) silicide, nickel (Ni) silicide, NiPt silicide or other suitable material to a thickness of about 2 nm to about 10 nm, in a portion of Si substrate 107, between STI regions 111, 113 and 115 and adjacent to fins 101, 103 and 105. A bottom spacer 125 is formed, e.g., of $SiO_2$, silicon nitride (SiN), silicon boron carbon nitride (SiBCN), silicon oxycarbonitride (SiOCN), silicon oxycarbide (SiOC), silicon carbonitride (SiCN), silicon carbide (SiC) or other suitable material as to a thickness of about 5 nm to about 20 nm, over silicide layer 123 and STI regions 111, 113, and 115.

Figure 2B:
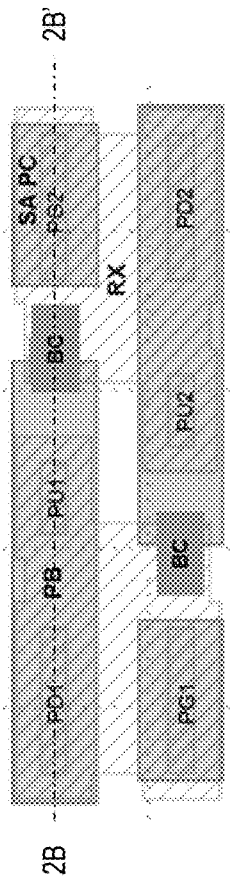
Figure 2A:
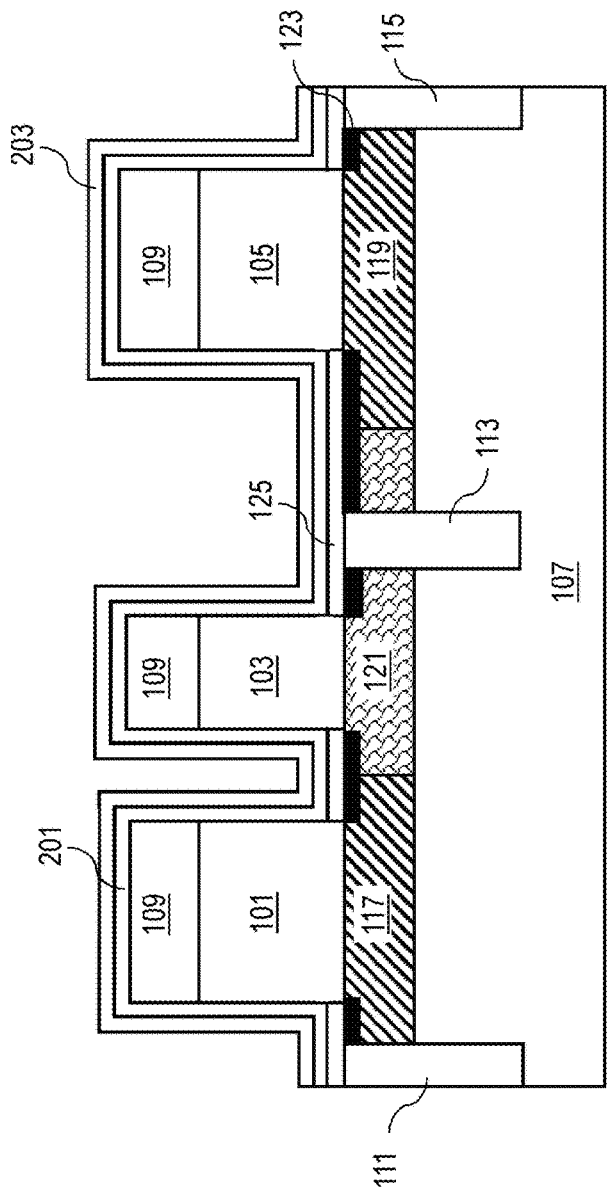

As illustrated in FIG. 2A, a high-k (HK) layer 201 is formed, e.g., of hafnium dioxide ($HfO_2$), zirconium dioxide ($ZrO_2$), hafnium zirconium oxide ($HfZrO_2$) or other suitable material as to a thickness of about 1.5 nm to about 5 nm, over bottom spacer 125 and HM 109, and on sidewalls of fins 101, 103, and 105. Subsequently, a work function metal (WFM) layer 203 is formed, e.g., of titanium nitride (TiN), titanium carbide (TiC), titanium aluminide (TiAl), titanium aluminum carbide (TiAlC), tantalum nitride (TaN) or other suitable material as to a thickness of about 1 nm to about 10 nm, over HK layer 201. As depicted in FIG. 3A, a masking layer 301 is formed, e.g., of an organic planarizing layer (OPL) or other suitable material, over a portion of WFM layer 203. A portion of WFM layer 203 and HK layer 201 is removed, e.g., by suitable etching processes, thereby forming recessed WFM layer 203' and recessed HK layer 201'. In one instance, this process is called WFM and HM chamfer.

Figure 6B:
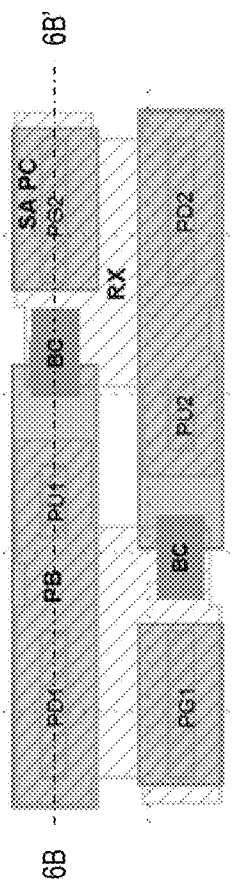
Figure 6A:
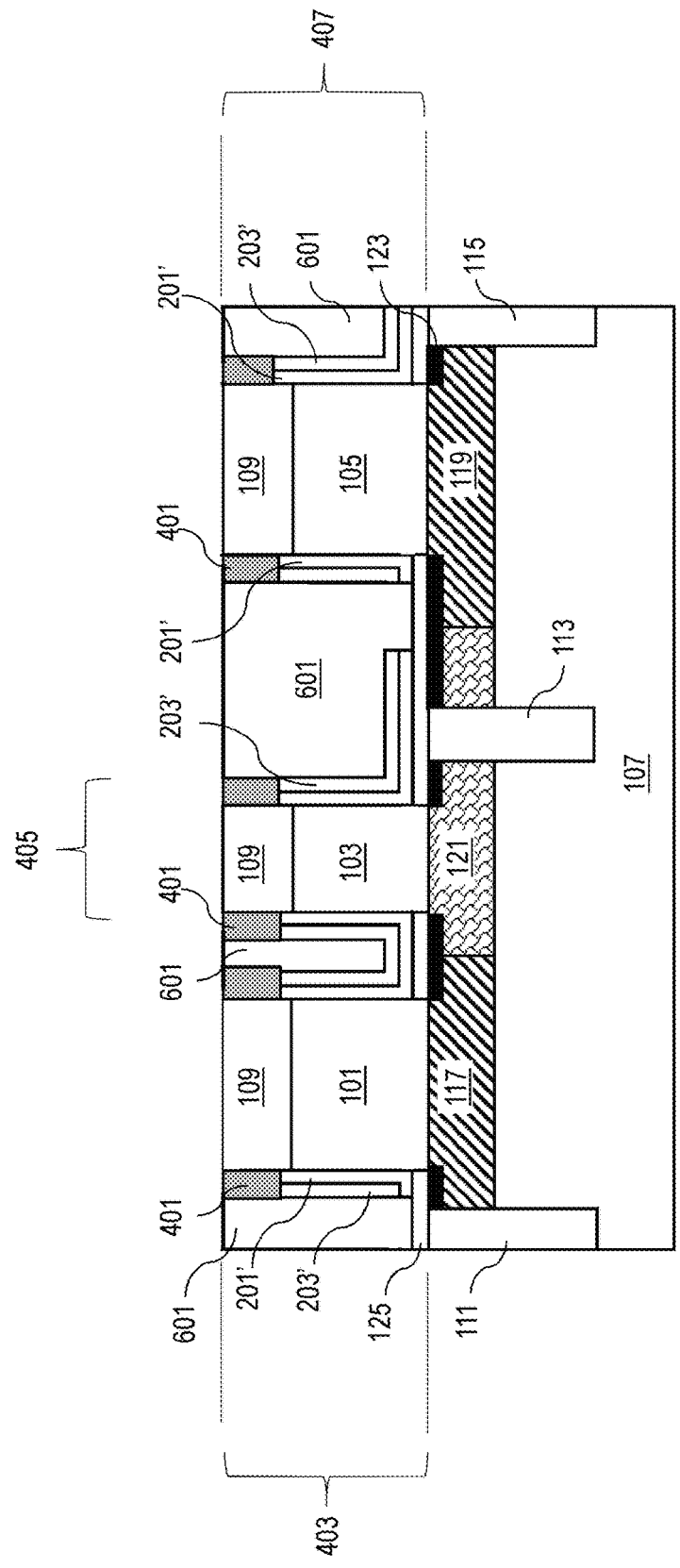

Referring to FIG. 4A, a spacer 401 is formed, e.g., of silicon oxycarbide (SiCO), SiC, SiCN or other suitable material as to a height of about 30 nm to about 150 nm and a width of about 3 nm to about 20 nm, over HK layer 201' and WFM layer 203' and on sidewall portions of HM 109, forming HKMG structures 403, 405, and 407. In this instance, the upper surface of spacer 401 is substantially coplanar to the upper surface of HM 109. Subsequently, masking layer 301 is removed, e.g., by ashing or other suitable etching process. As illustrated in FIG. 5A, a self-aligned gate (PC) patterning is performed. A masking layer 501 is formed, e.g., of OPL or other suitable material, over HKMG structure 405 and portions of HKMG structures 403 and 407, thereby exposing a portion of WFM layer 203 adjacent to HKMG structure 403, and between HKMG structures 405 and 407. Subsequently, a portion of WFM layer 203 and HK layer 201 are removed, by suitable etching processes, exposing a portion of the bottom spacer 125, and forming WFM layer 203' and HK layer 201'. The HKMG that are neither covered by spacer 401 nor masking layer 501 are etched away. In one instance, masking layer 501 defines the gate extension for PD/PU shared gate. Thereafter, masking layer 501 is removed. As depicted in FIG. 6A, an ILD 601 is formed over Si substrate 107 and planarized, e.g., by chemical mechanical planarization (CMP) or other suitable planarization processes. In this instance, the upper surface of ILD 601 is substantially coplanar to the upper surface of HKMG structures 403, 405, and 407.

Figure 7B:
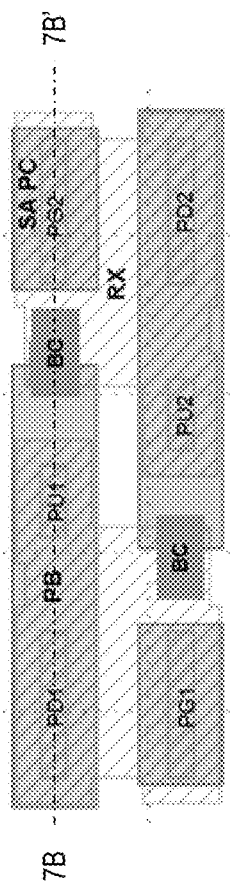
Figure 7A:
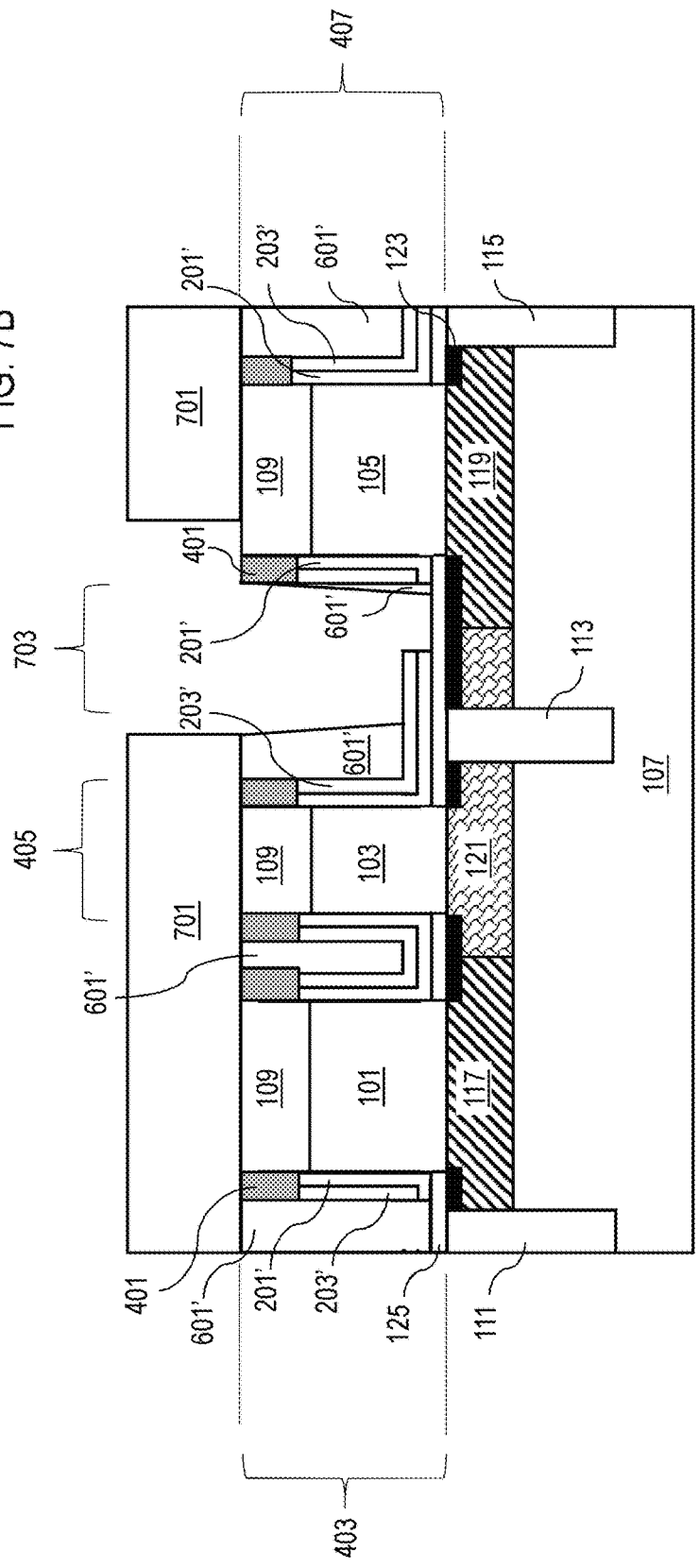
Figure 8B:
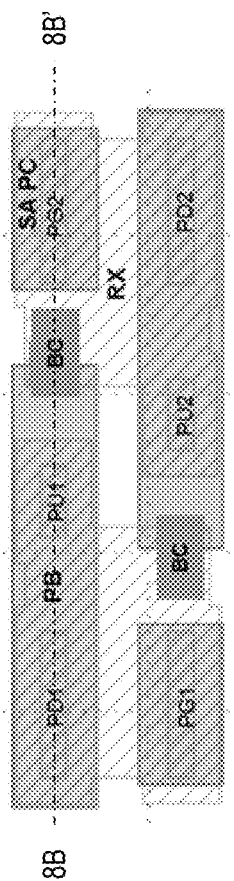
Figure 8A:
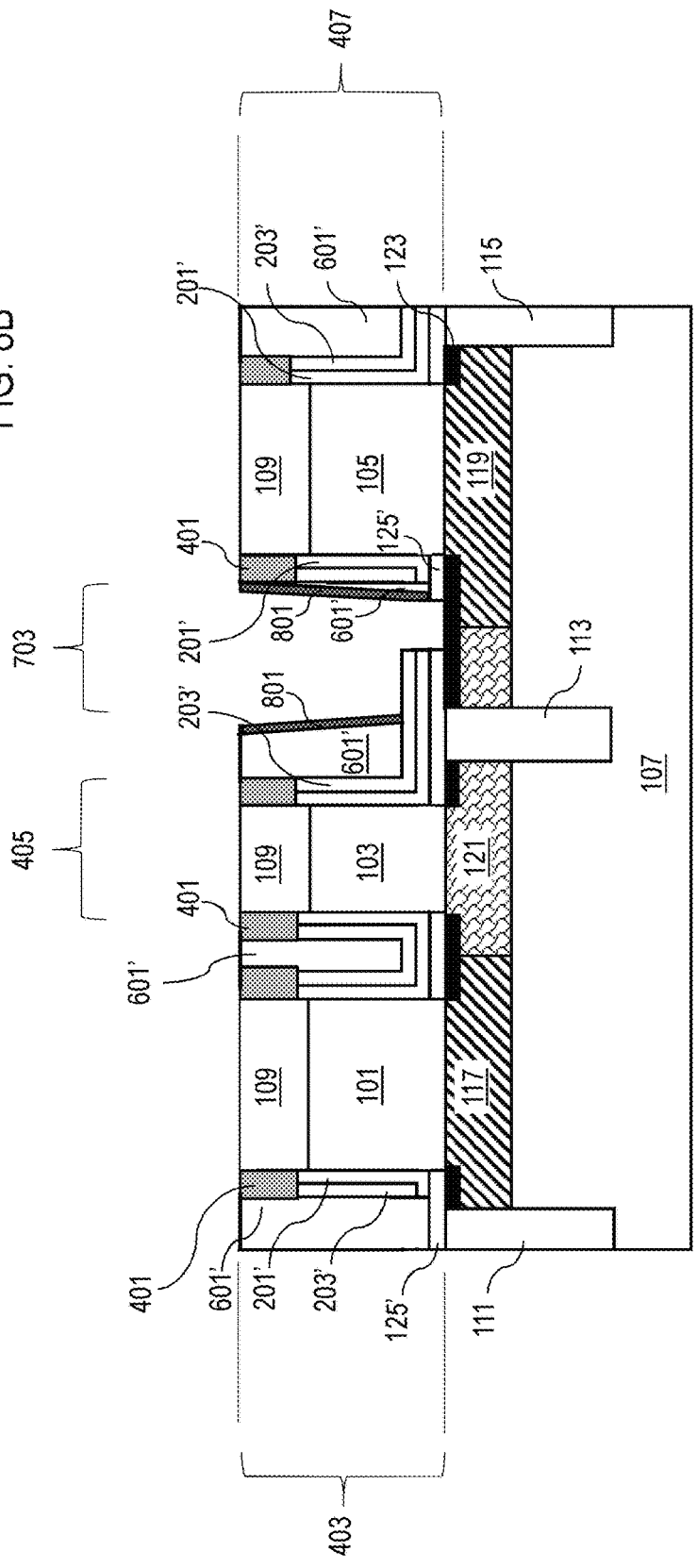

Referring to FIG. 7A, a masking layer 701 is formed, e.g., of OPL or other suitable material, over HKMG structures 403 and 405 and over a portion of ILD 601 and HKMG structure 407, thereby exposing a portion of ILD 601 between HKMG structures 405 and 407. Thereafter, a self-aligned buried contact etch is performed, wherein a portion of ILD 601 is removed, e.g., by reactive-ion etching (RIE) or other suitable technique, forming a buried contact trench 703. In this instance, ILD 601' is formed having a top width, e.g., of about 20 nm to about 50 nm, on the sidewalls of HKMG structures 405 and 407. As depicted in FIG. 8A, a spacer liner 801 is formed, e.g., to a width of about 4 nm to about 10 nm, on sidewalls of ILD 601' between HKMG structures 405 and 407. Thereafter, the exposed portion of bottom spacer 125 between HKMG structures 405 and 407 is removed, e.g., by RIE or other suitable technique, through buried contact trench 703, exposing a portion of silicide layer 123, and forming bottom spacer 125'. In an alternative process flow, bottom spacer 125 may be removed at a later stage in the process flow.

Referring to FIG. 9A, the exposed portion of silicide layer 123 is removed, e.g., by dry etch or other suitable technique, through the opening in bottom spacer 125', forming silicide layer 123'. Subsequently, a portion of bottom S/D regions 121 and 119 is optionally removed, e.g., by dry etch or other suitable technique, through the opening in silicide layer 123', forming bottom S/D regions 121' and 119'. As illustrated in FIG. 10A, a buried contact layer is formed, e.g., of a combination of thin layer of silicide at the bottom and other fill metals such as thin barrier metal liner TiN and low resistance metal such as copper (Cu), ruthenium (Ru), cobalt (Co), tungsten (W) or other suitable material in buried contact trench 703. Thereafter, the buried contact layer is recessed, e.g., by wet etch, dry etch or other suitable technique, forming buried contact layer 1001 having a thickness, e.g., of about 10 nm to about 50 nm above the bottom spacer 125'. In one instance, spacer liner 801 prevents buried contact layer from shorting to either PD/PU shared gate or an NFET PG gate. In another instance, spacer liner 801 prevents buried contact layer from damaging STI region 113. In another embodiment, the space between RX and RX may be reduced without degrading the size for buried contact layer 1001.

Figure 11B:
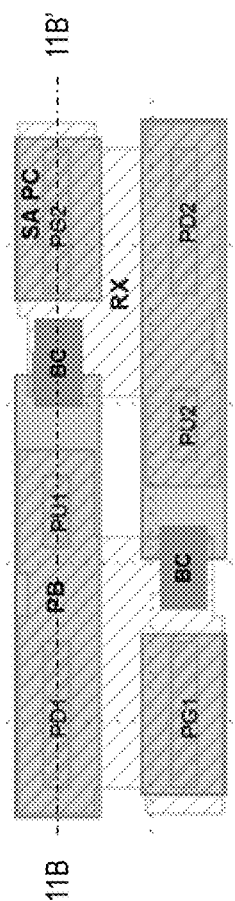
Figure 11A:
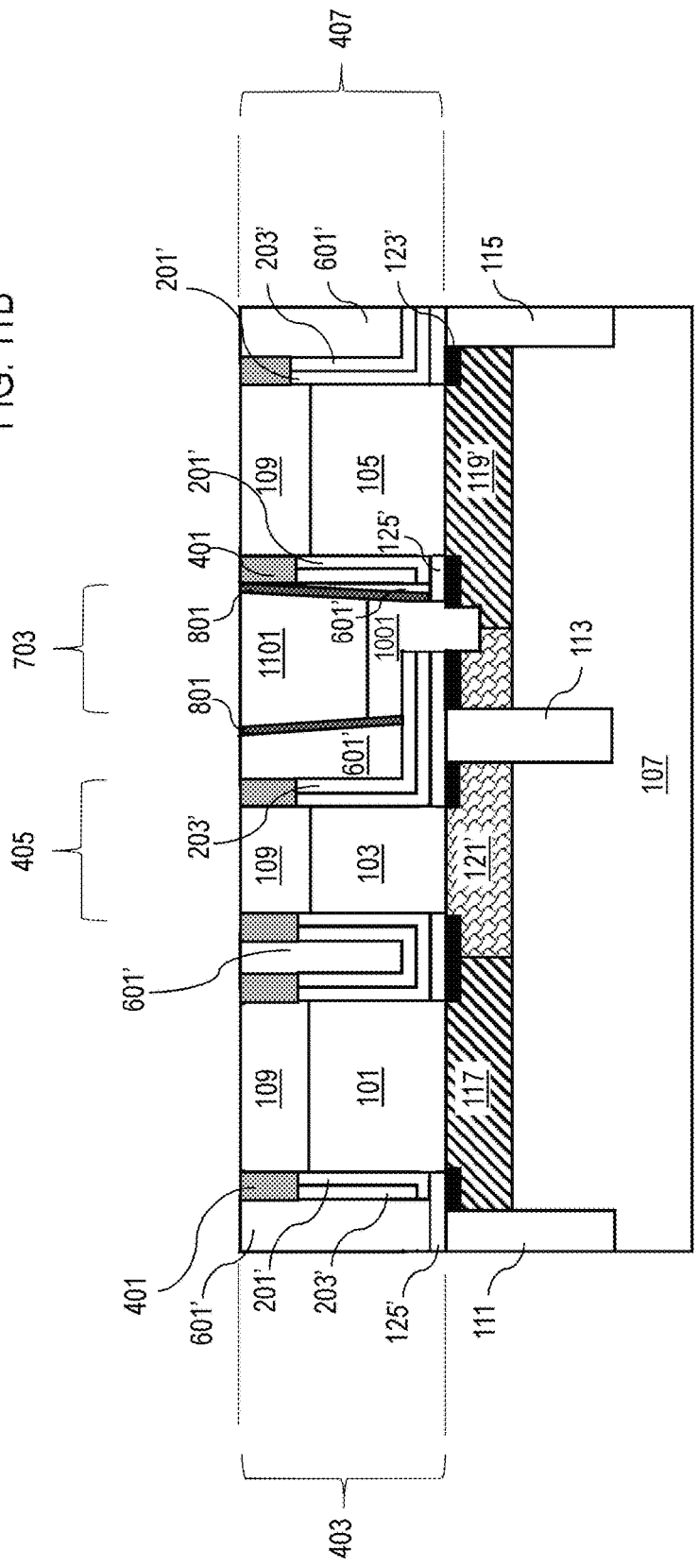

Referring to FIG. 11A, an ILD 1101 is formed over buried contact layer 1001, filling buried contact trench 703. Subsequently, ILD 1101 is planarized, e.g., by CMP or other suitable technique. In this instance, the upper surface of ILD 1101 is substantially coplanar to the upper surface of HKMG structures 403, 405, and 407. As depicted in FIG. 12A, HM 109 is removed, e.g., by selective wet or dry etch or other suitable technique. Subsequently, spacer 401 is removed, e.g., by selective wet or dry etch or other suitable technique. Thereafter, HK layer 201' and WFM layer 203' are recessed, e.g., by selective wet or dry etch or other suitable technique, forming HK layer 201" and WFM layer 203". An inner spacer 1201 is then formed, e.g., of SiN, $SiO_2$, SiC, SiCO, SiBCN, SiOCN, SiOC or other suitable material, as to a thickness of about 3 nm to about 10 nm, over HK layer 201" and WFM layer 203". A spacer 1203 is formed, e.g., of SiCO, or other suitable material, as to a thickness of about 5 nm to about 20 nm, over inner spacer 1201. Thereafter, top S/D regions 1205 and 1209 may be formed, e.g., by epitaxial growth of SiP, over HKMG structures 403 and 407, respectively, and top S/D region 1207 may be formed, e.g., by epitaxial growth of boron doped silicon germanium (SiGe:B), over HKMG structures 405. In an alternative process flow, bottom spacer 125 between HKMG structures 405 and 407 may be removed after forming top S/D regions 1205, 1207, and 1209. A capping layer may be formed over top S/D regions 1205, 1207, and 1209 for protecting top S/D regions 1205, 1207, and 1209. Referring back to FIG. 12A, source/drain (CA)/CB contacts 1211, 1213, and 1215 are formed through ILD 601' to top S/D regions 1205, 1207, and 1209, respectively. In one instance, CA/CB contacts 1211, 1213 and 1215 include, e.g., a thin layer of barrier metal liner such as TiN and low resistance metal fill material such as W, Ru, Co or other suitable material.

The embodiments of the present disclosure can achieve several technical effects, such as relaxing the space between PB and PC and/or implementing a minimum rule to benefit bit cell height scaling. The BC is wider, thereby increasing the contact area with PB and RX resulting in increased yield. In addition, the present method prevents shorting between BC and SA PC, thereby improving integration robustness. Furthermore, the gate to buried contact enclosure rule (PB.EX.BC) is not needed. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated semiconductor devices including VFETs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   first and second high-k/metal gate (HKMG) structures over a first portion of a substrate, and a third HKMG structure over a second portion of the substrate;
   an inter-layer dielectric (ILD) over a portion of the substrate and on sidewalls of the first, second and third HKMG structures;
   a spacer liner on sidewalls of the ILD between the second and third HKMG structures; and
   a buried contact layer between the spacer liner and in a portion of the substrate,
   wherein the spacer liner comprises a top surface, a first surface and a second side surface, wherein the top surface of the spacer liner is in direct contact with the ILD, wherein a portion of the first surface of the spacer liner is in direct contact with the ILD, and wherein a portion of the second surface of the spacer liner is in direct contact with the buried contact layer, and
   wherein the first, second and third HKMG structures comprise:
   a high-k (HK) on sidewall portions of first, second and third fin structures;
   a work function metal (WFM) layer over the HK layer;
   a first spacer over the HK layer and the WFM layer and on sidewall portions of the first, second and third fin structures; and
   a second spacer over the first spacer.

2. The device according to claim 1, wherein the substrate is a silicon (Si) substrate, a portion of the Si substrate below the first and third HKMG structures comprises silicon-phosphorus (SiP), and wherein a portion of the Si substrate below the second HKMG structure comprises silicon germanium doped with boron (SiGe:B).

3. The device according to claim 2, further comprising:
   shallow trench isolation (STI) regions in a portion of the Si substrate;
   a silicide layer in a portion of the Si substrate, between the STI regions, and adjacent to the first, second and third HKMG structures; and
   a bottom spacer over the silicide layer and the STI regions.

4. The device according to claim 1, further comprising:
   a top source/drain (S/D) regions over the first, second and third HKMG structures and between the first spacer.

5. The device according to claim 4, further comprising:
   a second ILD over the buried contact layer and the spacer liner; and
   a contact through the ILD to the top S/D regions layer, upper surface of the contact substantially coplanar to upper surface of the ILD.

6. The device according to claim 1, wherein the spacer liner has a width of 4 nanometer (nm) to 10 nm.

7. The device according to claim 1, wherein the buried contact layer has a thickness of 10 nanometer (nm) to 50 nm.

8. The device according to claim 1, wherein the buried contact layer comprises a combination of thin layer of silicide at the bottom and fill metals.

9. A device comprising:
   first and second high-k/metal gate (HKMG) structures over a first portion of a silicon (Si) substrate, and a third HKMG structure over a second portion of the Si substrate;
   an inter-layer dielectric (ILD) over a portion of the Si substrate and on sidewalls of the first, second and third HKMG structures;
   a spacer liner on sidewalls of the ILD between the second and third HKMG structures; and
   a buried contact layer between the spacer liner and in a portion of the Si substrate,
   wherein the spacer liner comprises a top surface, a first surface and a second side surface, wherein the top surface of the spacer liner is in direct contact with the ILD, wherein a portion of the first surface of the spacer liner is in direct contact with the ILD, and wherein a portion of the second surface of the spacer liner is in direct contact with the buried contact layer, and wherein the first, second and third HKMG structures comprise:
- a high-k (HK) layer on sidewall portions of first, second and third fin structures;
- a work function metal (WFM) layer over the HK layer;
- a first spacer over the HK layer and the WFM layer and on sidewall portions of the first, second and third fin structures;
- a second spacer over the first spacer; and
- a top source/drain (S/D) regions over the first, second and third HKMG structures and between the first spacer.

10. The device according to claim 9, further comprising:
shallow trench isolation (STI) regions in a portion of the Si substrate;
a silicide layer in a portion of the Si substrate, between the STI regions, and adjacent to the first, second and third HKMG structures; and
a bottom spacer over the silicide layer and the STI regions,
wherein a portion of the Si substrate below the first and third HKMG structures comprises silicon-phosphorus (SiP), and wherein a portion of the Si substrate below the second HKMG structure comprises silicon germanium doped with boron (SiGe:B).

* * * * *